(12) United States Patent
Tseng et al.

(10) Patent No.: US 7,904,855 B2
(45) Date of Patent: Mar. 8, 2011

(54) METHODS FOR PARTIALLY REMOVING CIRCUIT PATTERNS FROM A MULTI-PROJECT WAFER

(75) Inventors: Yi-Hong Tseng, Hsin-Chu (TW); Kuan-Liang Wu, Taipei (TW)

(73) Assignee: Taiwan Semiconductor Manufacturing Company, Ltd., Hsin-Chu (JP)

( * ) Notice: Subject to any disclaimer, the term of this patent is extended or adjusted under 35 U.S.C. 154(b) by 186 days.

(21) Appl. No.: 11/536,927

(22) Filed: Sep. 29, 2006

(65) Prior Publication Data

US 2007/0264798 A1    Nov. 15, 2007

Related U.S. Application Data

(60) Provisional application No. 60/792,273, filed on Apr. 14, 2006.

(51) Int. Cl.
*G06F 17/50* (2006.01)
*H01L 21/00* (2006.01)

(52) U.S. Cl. .................................. 716/100; 438/460

(58) Field of Classification Search .................. 716/1, 2; 438/460
See application file for complete search history.

(56) References Cited

U.S. PATENT DOCUMENTS

| | | | | |
|---|---|---|---|---|
| 4,144,536 | A * | 3/1979 | Ardezzone et al. | 346/33 F |
| 6,788,091 | B1 * | 9/2004 | Weber | 324/765 |
| 6,943,429 | B1 * | 9/2005 | Glenn et al. | 257/620 |
| 7,032,191 | B2 * | 4/2006 | Malekkhosravi et al. | 716/2 |
| 7,197,723 | B2 * | 3/2007 | Braun et al. | 716/3 |
| 7,393,754 | B2 * | 7/2008 | Iwane et al. | 438/401 |
| 7,538,000 | B2 * | 5/2009 | Dao | 438/287 |
| 2003/0047543 | A1 * | 3/2003 | Peng et al. | 219/121.68 |
| 2003/0097644 | A1 * | 5/2003 | Hong | 716/2 |
| 2004/0181769 | A1 * | 9/2004 | Kochpatcharin et al. | 716/19 |
| 2005/0149899 | A1 * | 7/2005 | Chao et al. | 716/19 |
| 2005/0193353 | A1 * | 9/2005 | Malekkhosravi et al. | 716/1 |
| 2006/0074506 | A1 * | 4/2006 | Braun et al. | 700/96 |
| 2006/0105545 | A1 * | 5/2006 | Tseng et al. | 438/460 |
| 2007/0289957 | A1 * | 12/2007 | Eiterer et al. | 219/121.78 |

(Continued)

FOREIGN PATENT DOCUMENTS

WO    2005110662 A1    11/2005

OTHER PUBLICATIONS

Bernold Richerzhagen, Delphine Perrottet and Yasushi Kozuki, "Dicing of Wafers by Patented Water-Jet-Guided Laser; The Total Damage-Free Cut," JLPS 2005, Jun. 12, 2005, Tokyo, Japan.

(Continued)

*Primary Examiner* — Stacy A Whitmore
*Assistant Examiner* — Magid Y Dimyan
(74) *Attorney, Agent, or Firm* — Haynes and Boone, LLP

(57) ABSTRACT

Disclosed are a method and a system for partially removing circuit patterns from a multi-project wafer. This method and this system can be used to provide a multi-project-wafer to a user without disclosing proprietary circuit information of other customers. At least one integrated circuit design of a user is identified from a plurality of integrated circuit designs of a plurality of users. Those unidentified circuits can be totally removed through circuit removing method. Then the modified multi-project wafer can be delivered to the user without concerns about disclosing information of unidentified circuits which belongs to other customers. In one embodiment, a laser system may be used to totally remove the unidentified integrated circuit designs without impacting the circuit performance of identified circuits. In another embodiment, a diamond-blade saw may also be used to totally remove the unidentified integrated circuit designs without impacting the circuit performance of identified circuits.

20 Claims, 4 Drawing Sheets

U.S. PATENT DOCUMENTS

2009/0239313 A1* 9/2009 Anemikos et al. ............ 438/5

OTHER PUBLICATIONS

Woo Chun Choi and George Chryssolouris, "Analysis of the Laser Grooving and Cutting Processes," Journal of Physics. D. Applied physics, 1995, pp. 873-878, vol. 28, n-5, IOP Publishing Ltd., United Kingdom.

"The Water Jet Guided Laser Technology," Synova S.A., http://www.synova.ch/main.php, printed on Mar. 27, 2006.

Chinese Patent Office, Chinese Office Action, Aug. 14, 2009, 5 Pages, Application No. 20081016911X.

* cited by examiner

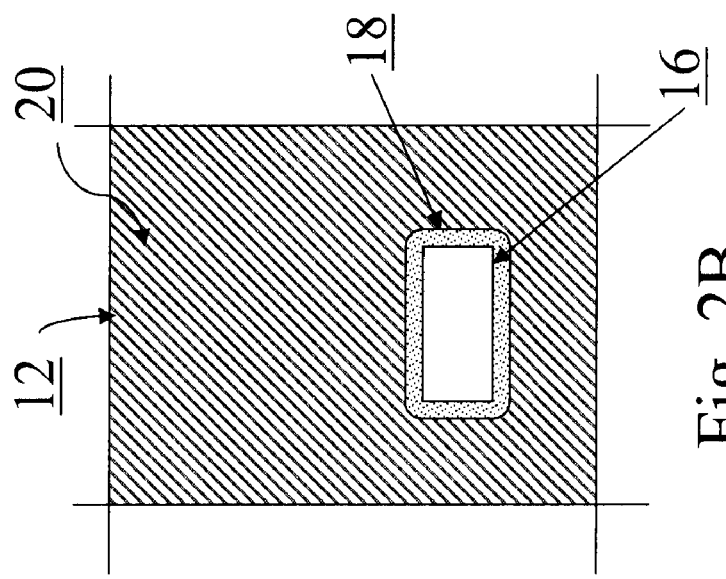
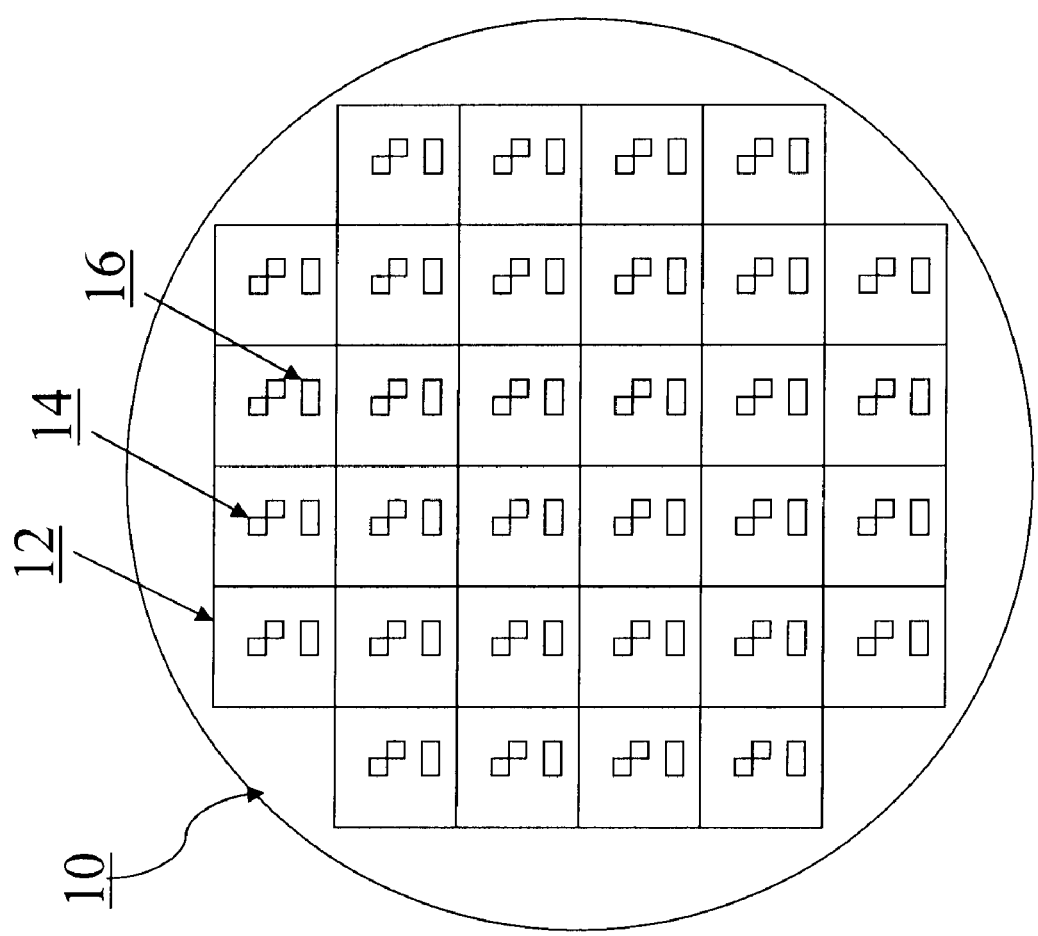
Fig. 2B
Fig. 2A

METHODS FOR PARTIALLY REMOVING CIRCUIT PATTERNS FROM A MULTI-PROJECT WAFER

CROSS-REFERENCE

The present application claims the benefit of U.S. Ser. No. 60/792,273, which was filed Apr. 14, 2006, and is hereby incorporated by reference.

BACKGROUND

The present disclosure relates in general to semiconductor manufacturing technology, and more particularly, to a system and method to provide a multi-project wafer to a user without sacrificing proprietary circuit information of other customers.

With the advancement of VLSI technologies, the mask cost has been dramatically increased. The shuttle mask solution, also known as multi-project wafer (MPW), has been widely accepted as an economical solution for product prototyping and small volume production by putting different chips on a mask set to share the mask costs through a multiple-project wafer. For example, in a simple MPW cost model where each design is mainly charged based on the area it occupies on the mask, the mask cost will be greatly reduced because the mask cost is shared by multiple designs However, the delivery of multi-project wafers create proprietary information concerns, because customers' designs are exposed to others who share the same mask and wafer. One current technique to address this proprietary information concern is to cut the fabricated integrated circuits (die) from the wafer to provide customers only their own die. Each die having a specific customer's design is placed in a waffle tray and delivered to the corresponding customer.

While this technique protects proprietary information from being exposed to other customers, this may not meet the customer's needs. For example, wafer level testing or packaging in the prototyping stage may not be performed because only individual dies, not the full wafer, are provided to the customer. This also affects the customer's time-to-market and their abilities to collect statistical circuit information from the bare dies singulated from a wafer. Therefore, a need exists for a method and system for providing a multi-project wafer to a user, such that the user may perform wafer level testing and packaging without improperly exposing other's proprietary information.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 2A is a diagram of an exemplary multi-project wafer after laser grooving.

FIG. 2B is a diagram of an exemplary die from the multi-project wafer of FIG. 2A.

DETAILED DESCRIPTION

Figure 1:
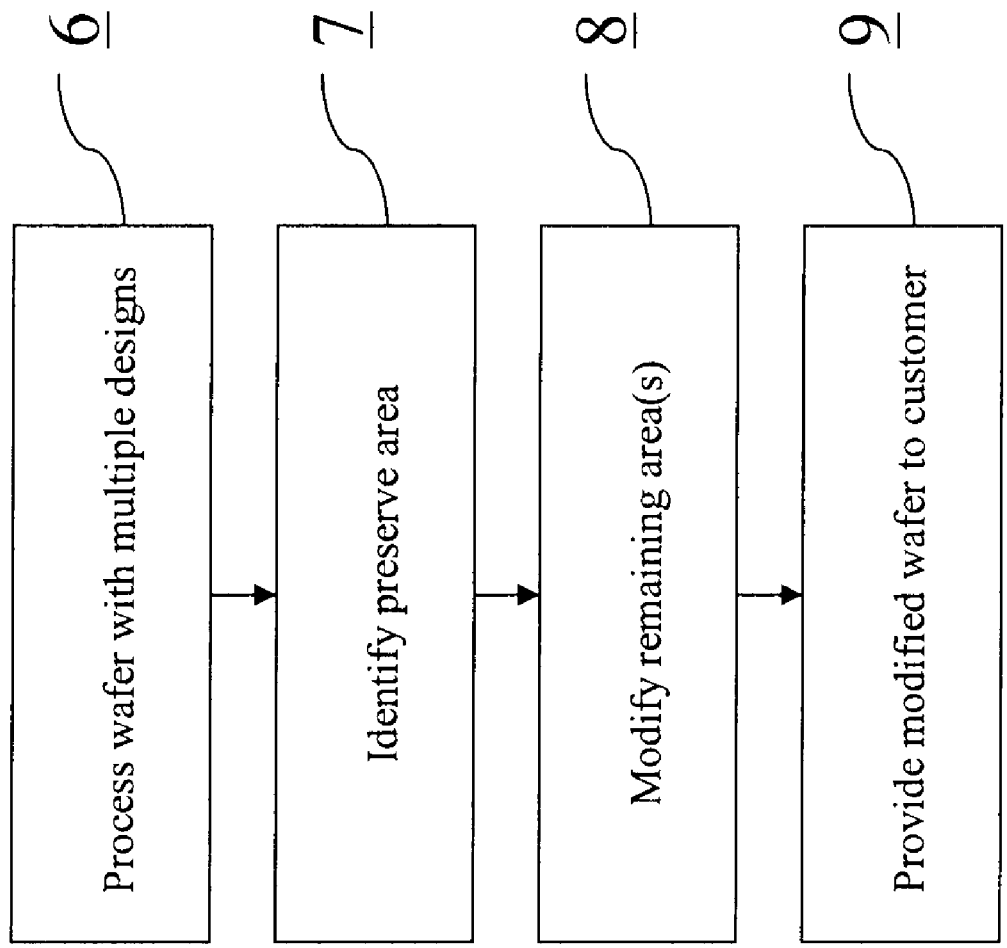
FIG. 1 is a flow chart of a method for providing a multi-project wafer to a user according to one embodiment of the present invention.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Referring to FIG. 1, a method 5 can be used to combine projects (hereinafter generally referred to as "integrated circuit designs") from multiple entities, users, designers, or customers (hereinafter generally referred to as "users" or "customers") on a single wafer, and then provide the wafer to one of the customers to allow wafer-level testing, packaging, or any other further action by the customer, without the customer being exposed to projects from other customers. Execution begins at step 6, where a wafer is processed with multiple designs. At step 7, one or more designs of a particular customer are identified, and one or more "preserve areas" are identified to encompass the identified design(s). At step 8, areas other than the preserve area are modified to hide, remove, or disguise any designs of other customers. In one embodiment, a laser system may be used to destroy or remove the remaining areas, leaving only the projects left in the preserve areas. At step 9, the wafer is provided to the customer.

Referring to FIG. 2A, a diagram illustrating an exemplary multi-project wafer 10 is depicted. Multi-project wafer 10 comprises a plurality of dies 12. Each die represents an area of the wafer 10 that includes one or more separate integrated circuit designs. For example, a die may comprise 10 to 20 designs. Each of the integrated circuit designs may be provided by a different user or customer. For example, design 14 is provided by customer A and design 16 is provided by customer B.

Referring to FIG. 2B, preserve areas 18 are identified on the wafer 10. It is understood that although the figure only shows a single die and a single preserve area, there may be many more preserve areas on the other die of the multi-project wafer 10. In the illustrated embodiment, the preserve areas 18 are inclusive of the design 16 provided by customer B.

The remaining areas of the die 12 are modified according to one or more embodiments of the present invention so that they are significantly removed from the multi-project wafer 10. An integrated circuit is significantly removed from the multi-project wafer when at least a portion of the circuit is removed, damaged, or otherwise modified to make the circuit in-operable and more difficult to reverse engineer. It is understood that there may still be portions of the significantly removed integrated circuit remaining.

In one embodiment, a laser grooving process is applied to destroy and/or remove some or all of the integrated circuit designs of other users that lie in the remaining areas. As a result, each wafer only comprises the integrated circuit design(s) in the protected areas 18. In continuation of the previous example, preserve area 18 comprises a single integrated circuit design 16, which is provided by customer B. The integrated circuit design 14 provided by customer A (FIG. 2A) is located in a laser grooved area 20 of the die and has been destroyed or removed. Since only preserved area 18 remains in the plurality of die 12 of multi-project wafer 10, the full multi-project wafer 10 may be provided to customer B for wafer level testing or packaging in the prototyping stage without sacrificing proprietary information of customer A.

In some embodiments, a customer may have multiple integrated circuit designs on a single multi-project wafer. Also, the multi-project wafer may include test circuits or other non-proprietary designs that do not need to be removed. The preserve area may include one or more of the customer's integrated circuit designs and/or non-proprietary designs, while still removing or otherwise modifying other integrated circuit designs on the multi-project wafer.

Figure 3A:
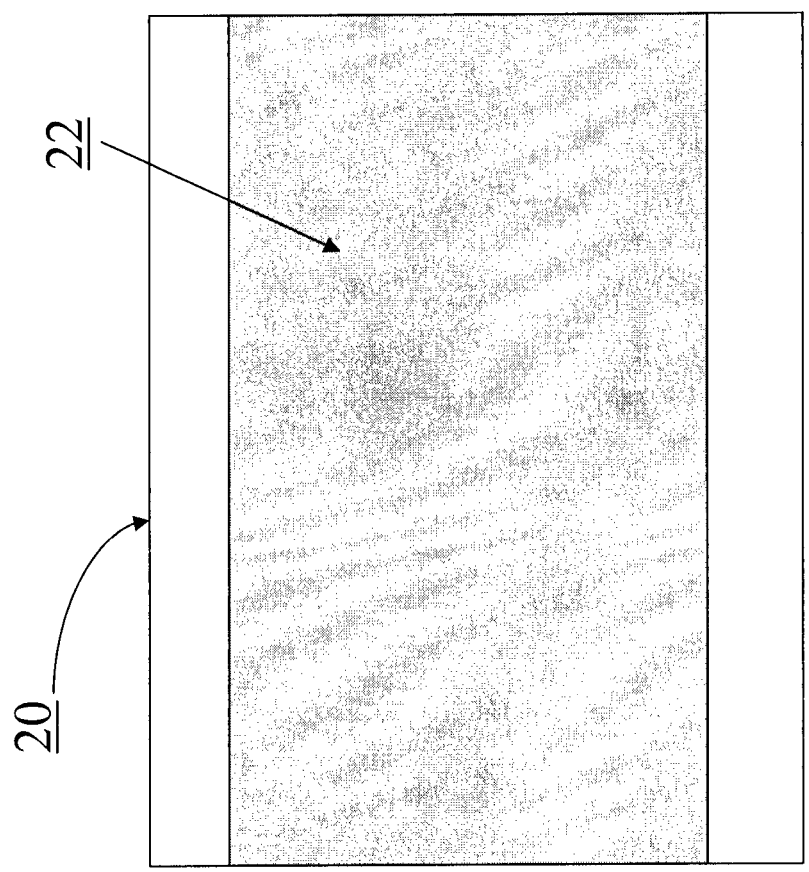
FIG. 3A is a diagram illustrating a cross section of the preserved area of the die of FIG. 2B.

Referring to FIG. 3A, a diagram illustrating a cross section of the preserved area is depicted. The integrated circuit design 16, which may include a plurality of different layers, as shown, remains in the plurality of dies 12 of the multi-project wafer 10.

Figure 3B:
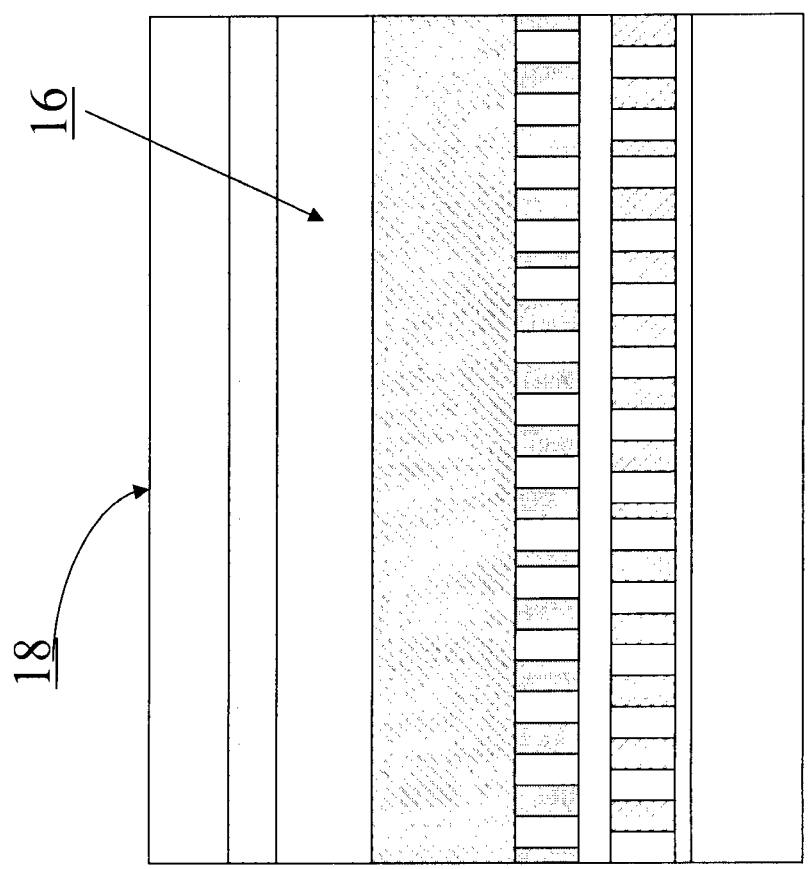
FIG. 3B is a diagram illustrating a cross section of the laser grooved area of the die of FIG. 2B.

Referring to FIG. 3B, a diagram illustrating a cross section of the laser grooved area is depicted. After integrated circuit designs of other users, such as integrated circuit design 14, are removed by the laser from the plurality of dies 12, the laser grooved area 20 has effectively modified, disguised, hidden, and/or removed the previous circuit design 14. In the present embodiment, the remaining area has been sufficiently modified to create an indiscernible structure 22. As a result, proprietary information of the customer A is not exposed to customer B.

Figure 4:
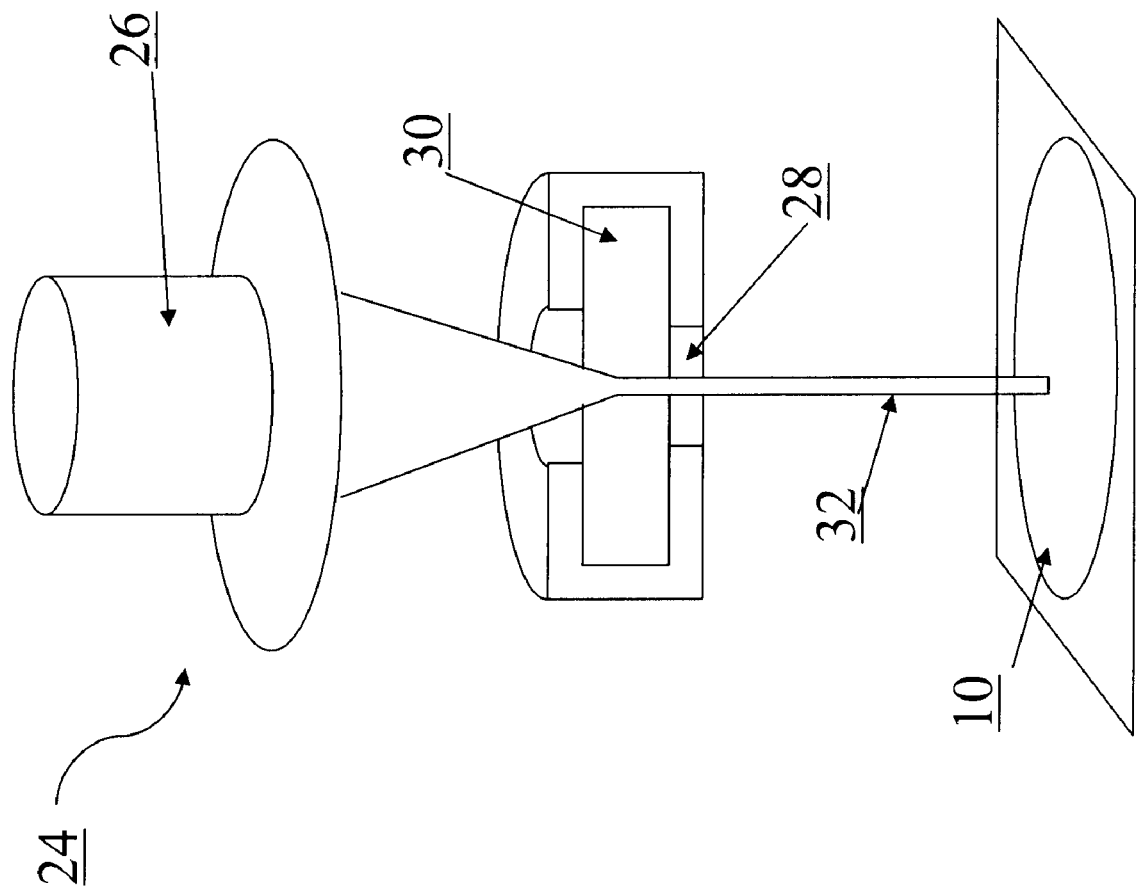
FIG. 4 is diagram illustrating an exemplary system for laser grooving, according to one embodiment of the present invention.

Referring to FIG. 4, an example of a system for laser grooving is designated with the reference number 24. The laser system 24 includes a chuck for holding the multi-project wafer 10, a laser for producing a beam 26 and a nozzle for providing a fluid. The laser beam 26 is focused towards the nozzle 28 while passing through a pressurized water chamber 30. The fluid (e.g., water) emitted from the nozzle 28 guides the laser beam 26 by means of total internal reflection that takes place at the water air interface. The focused laser beam 32 then destroys or removes the integrated circuit designs of other users on the multi-project wafer 10.

Since the water jet guided laser system 24 uses water to guide the laser beam 26, heat damage within the material is prevented by cooling the cutting edges between laser pauses. The heat-affected zone is greatly reduced. In addition, the use of water to remove molten material is much more efficient. Furthermore, particle deposition on the wafer surface may be avoided with the thin water film generated by the water jet.

It is understood that a water jet guided laser system is only one example of a system used to modify the remaining areas of the die 12. In another example, a regular (non-water jet guided) laser can be used to effectively disable one or more portions of device 14. In continuation of this example, the device 14 can include a fuse that can be later ablated to thereby disable the device.

In another embodiment, a mechanical saw or scoring device can be used, with or without a fluid. For example, a water-cooled diamond saw or a diamond-blade dicing saw can be used to effectively remove the device 14 from the multi-project wafer 10.

Therefore, a method of integrated circuit design manufacturing is provided. The method includes fabricating two or more different integrated circuit designs on a single, multi-project wafer and identifying an area that includes at least one of the integrated circuit designs directed to a user. The method further includes modifying at least a portion of the multi-project wafer outside the area, the portion including at least one of the integrated circuit designs and providing the modified multi-project wafer to the user.

In some embodiments, modifying at least a portion of unidentified integrated circuit designs on the multi-project wafer includes identifying a portion of at least one integrated circuit design from the two or more integrated circuit designs not belonging to the user and destroying the portion of the at least one integrated circuit design from the multi-project wafer.

In some embodiments, removing the portion of the at least one integrated circuit design from the multi-project wafer includes destroying the portion of the at least one integrated circuit design using a laser grooving process. The laser grooving process may include focusing a laser beam onto a nozzle while passing through a pressurized fluid chamber, emitting fluid from the nozzle to guide the laser beam, and destroying the portion of the at least one integrated circuit design from the multi-project wafer using guided laser beam. In some embodiments, the fluid from the nozzle is water, which thereby reduces heat damage to the multi-project wafer.

In some embodiments, destroying the portion of the at least one integrated circuit design from the multi-project wafer includes destroying the portion of the at least one integrated circuit design using a diamond-blade saw. In some embodiments, destroying the portion of the at least one integrated circuit design from the multi-project wafer includes destroying the portion of the at least one integrated circuit design using a non-water jet guided laser.

The present disclosure also provides a system for manufacturing a multi-project wafer. The system includes a chuck for holding a multi-project wafer, the wafer including a plurality of die and a mechanism configured to significantly remove at least one of the plurality of dies without modifying another of the plurality of die.

In some embodiments, the mechanism includes a laser beam focused onto a nozzle, the laser beam passing through a pressurized fluid chamber. A fluid jet emitted from the nozzle onto surface of the multi-project wafer guides the laser beam to destroy the second project. In some embodiments, the fluid jet is also configured to guide fluid, such as water, towards the multi-project wafer.

The present disclosure also provides another system for providing a multi-project wafer. The system includes a processing system for fabricating a plurality of dies onto the multi-project wafer, wherein each of the plurality of dies comprises a first project of a first user and a second project of a second user. The system also includes a diamond-blade saw for modifying the second project from the plurality of dies.

In summary, aspects of the present disclosure provide a method and system for providing a multi-project wafer to a user without sacrificing proprietary information. By using a laser to destroy or remove integrated circuit designs, proprietary information of one user is protected from exposure to other users of the multi-project wafer. As a result, the multi-project wafer may be provided to the customer for wafer level testing or packaging in the prototyping stage.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method of integrated circuit design manufacturing, the method comprising:
   fabricating a first integrated circuit design directed to a first project and a second integrated circuit design directed to a second project on a single, multi-project wafer, wherein the first integrated circuit design is different than the second integrated circuit design;
   identifying an area that includes the first integrated circuit design directed to the first project;
   modifying at least a portion of the multi-project wafer outside the area, the portion including the second integrated circuit design directed to the second project; and
   providing the modified multi-project wafer to a user associated with the first project, wherein the modified portion is indiscernible to the user.

2. The method of claim 1, wherein modifying at least a portion of the multi-project wafer outside the area comprises:
   identifying a portion of the second integrated circuit design directed to the second project; and
   destroying the portion of the second integrated circuit design from the multi-project wafer.

3. The method of claim 2, wherein destroying the portion of the second integrated circuit design from the multi-project wafer comprises:
   destroying the portion of the second integrated circuit design using a laser grooving process.

4. The method of claim 2, wherein destroying the portion of the second integrated circuit design from the multi-project wafer comprises:
   destroying the portion of the second integrated circuit design using a diamond-blade saw.

5. The method of claim 2, wherein destroying the portion of the the second integrated circuit design from the multi-project wafer comprises:
   destroying the portion of the second integrated circuit designs using a non-water jet guided laser.

6. The method of claim 1, wherein the area includes a plurality of integrated circuits from the user.

7. The method of claim 1, wherein the area includes non-proprietary components.

8. A method of integrated circuit design manufacturing, the method comprising:
   fabricating two or more different integrated circuit designs on a single, multi-project wafer;
   identifying an area that includes at least one of the integrated circuit designs directed to at least one project;
   modifying at least a portion of the multi-project wafer outside the area, the portion including at least one of the integrated circuit designs; and
   providing the modified multi-project wafer to a user, wherein modifying at least a portion of the multi-project wafer outside the area comprises:
   identifying a portion of at least one of the integrated circuit designs from the two or more different integrated circuit designs not belonging to the project; and
   destroying the portion of the at least one integrated circuit design from the multi-project wafer,
   wherein destroying the portion of the at least one integrated circuit design from the multi-project wafer comprises:
   destroying the portion of the at least one of the integrated circuit designs using a laser grooving process,
   wherein the laser grooving process comprises:
      focusing a laser beam onto a nozzle while passing through a pressurized fluid chamber;
      emitting fluid from the nozzle to guide the laser beam; and
      destroying the portion of the at least one of the integrated circuit designs from the multi-project wafer using guided laser beam.

9. The method of claim 8, wherein the fluid from the nozzle is water, which thereby reduces heat damage to the multi-project wafer.

10. The method of claim 9, wherein the water from the nozzle is emitted from the muzzle in such a manner so as to reduce particle deposition on a surface of the multi-project wafer.

11. A method for protecting information on a multi-project wafer, the method comprising:
   processing the multi-project wafer with a first design provided by a first user and a second design provided by a second user;
   altering the second design so that the first user is inhibited from discerning the second design; and
   providing the multi-project wafer to the first user.

12. The method of claim 11, further comprising establishing a preserve area that contains the first design, wherein the preserve area identifies an area of the multi-project wafer that remains unaltered.

13. The method of claim 11, further comprising performing wafer level testing and packaging by the first user without being able to reverse engineer the second design.

14. The method of claim 11, wherein altering the second design comprises:
   identifying a region of the multi-project wafer that contains the second design; and
   destroying at least a portion of the region of the multi-project wafer.

15. The method of claim 14, wherein destroying at least a portion of the region comprises destroying proprietary information of the second design using a laser grooving process.

16. The method of claim 15, wherein the laser grooving process comprises:
   focusing a laser beam onto a nozzle while passing through a pressurized fluid chamber;
   emitting fluid from the nozzle to guide the laser beam; and
   destroying the proprietary information using the guided laser beam.

17. The method of claim 16, wherein the fluid from the nozzle is water, which thereby reduces heat damage to the multi-project wafer.

18. The method of claim 17, wherein the water from the nozzle is emitted from a muzzle in such a manner so as to reduce particle deposition on a surface of the multi-project wafer.

19. The method of claim 11, wherein the first design includes a plurality of first integrated circuits.

20. The method of claim 19, wherein the second design includes a plurality of second integrated circuits different from the plurality of first integrated circuits.

* * * * *